United States Patent [19]

Pisciotta et al.

[11] 4,144,448
[45] Mar. 13, 1979

[54] ASYNCHRONOUS VALIDITY CHECKING SYSTEM AND METHOD FOR MONITORING CLOCK SIGNALS ON SEPARATE ELECTRICAL CONDUCTORS

[75] Inventors: Emilio C. Pisciotta, Boulder; Tony G. Thornock, Longmont, both of Colo.

[73] Assignee: International Business Machines Corporation, Armonk, N.Y.

[21] Appl. No.: 855,632

[22] Filed: Nov. 29, 1977

[51] Int. Cl.² ............................................. G06F 11/00
[52] U.S. Cl. .................................. 235/301; 328/120; 364/900
[58] Field of Search ...................... 235/301; 328/120; 364/900

[56] References Cited

U.S. PATENT DOCUMENTS

| | | | |
|---|---|---|---|
| 2,844,721 | 7/1958 | Minkow | 235/301 |
| 3,320,440 | 5/1967 | Reed | 235/301 |
| 3,399,351 | 8/1968 | Reszka | 328/120 |
| 3,899,665 | 8/1975 | Gaon | 235/301 |
| 4,023,109 | 5/1977 | Shreve | 235/301 |

*Primary Examiner*—Charles E. Atkinson
*Attorney, Agent, or Firm*—Herbert F. Somermeyer

[57] ABSTRACT

An asynchronous validity checking system and method is disclosed for monitoring a plurality of clock signals carried on separate electrical conductors to assure continuing transitions of each clock signal. A master clock is utilized to produce a plurality of phase-related clock signals on the separate electrical conductors, and the transitions of the clock signals are sensed on each electrical conductor adjacent to the distribution point to a controlled unit to assure that all clock signals are continuously operational. The validity checking system includes a locking synchronizer having a plurality of flip-flops each of which receives a different one of the clock signals and a timing signal from a timing oscillator that is independent of, and asynchronous with respect to, the clock signals from the master oscillator with the clock signals being locked into the flip-flops on the rising leading edges of the pulses of the timing signal. A sequence and presence checking unit receives the output signals from the flip-flops and produces reset pulses which are coupled to digital counters incremented by the falling trailing edges of counter clock pulses that are frequency related to the timing signal pulses coupled to the locking synchronizer. As long as transitions of the clock signals are sensed on each of the electrical conductors to reset the counters within a predetermined period of time, no fault indication is produced. If a transition is not sensed, however, the counters are not reset within the predetermined period of time and a fault indication is produced that is indicative of a defect in a clock signal. Upon sensing of the failure of a transition of a clock signal, a fault indication is produced which may be utilized to automatically effectively stop the clock, selectively switch power off, or switch the master clock from a controlled unit, such as a magnetic recording device, to prevent damage and/or information loss.

21 Claims, 9 Drawing Figures

ASYNCHRONOUS VALIDITY CHECKING SYSTEM AND METHOD FOR MONITORING CLOCK SIGNALS ON SEPARATE ELECTRICAL CONDUCTORS

FIELD OF THE INVENTION

This invention relates to a multiple conductor signal transition monitoring system and method, and, more particularly, relates to an asynchronous validity checking system and method for monitoring transitions of clock signals on separate electrical conductors.

BACKGROUND OF THE INVENTION

The use of timing signals in electronic apparatus is well known. Such timing signals have heretofore been commonly derived from one or more timing signal generators such as a master clock that provided an output train of clock pulse to the electronic apparatus for timing purposes.

Where an electronic apparatus is dependent upon receiving timing, or a plurality of clock pulses from a master clock, such apparatus can often be damaged if the master clock, or one or more derivatives thereof, should fail. This is particularly true where a microprocessor, programmed logic array (PLA), or other form of clocked digital logic circuits are in a control or other sensitive environment. For example, where a master clock system is utilized to control a motor driven digital, or magnetic data, recording device, and where clock pulses may also generate recording signal timing, the clocked motor control and/or motion validity checking could become unstable and cause apparatus damage and/or information loss if the master clock or one or more derivatives of the master clock should fail.

Systems and methods have heretofore been suggested and/or developed for sensing clock failure. General examples of such systems and methods may be found, for example, in U.S. Pat. Nos. 3,496,477 and 3,458,822.

In addition, systems and methods have been heretofore suggested and/or utilized for sensing different characteristics of a plurality of pulses in a pulse train, such as, for example, failure of one or more of the pulses in the pulse train and/or detection of gaps or the like in the pulse train. In this respect, see, for example, U.S. Pat. Nos. 3,068,367; 3,399,351; 3,800,234; and 3,903,474. In addition, detection of pulse failure within a pulse train after a predetermined time interval utilizing resetable counters has heretofore been suggested (see U.S. Pat. No. 3,350,580), and systems have heretofore been suggested for detecting failure of either one of a pair of timing generators including detection where an output signal from either generator is stuck and does not transition (see, for example, U.S. Pat. No. 3,795,867).

A monitoring system and method has still been needed, however, that is capable of monitoring a plurality of electrical conductors to assure the occurrence of transitions of the signals on each of the conductors, and particularly to assure monitoring of clock signals on a plurality of electrical conductors to assure transitions of each clock signal adjacent to the point of distribution to a controlled apparatus, and furthermore having the clock signals timed by a plurality of asynchronous timing pulses.

SUMMARY OF THE INVENTION

This invention provides a novel system and method for monitoring a plurality of electrical conductors to assure the occurrence of signal transitions on each conductor. This invention also provides a novel system and method that is particularly useful for assuring transitions of a plurality of clock signals from a master clock carried on separate electrical conductors with the transitions being sensed adjacent to the distribution point of each of the clock signals to a controlled device, such as a magnetic data recording apparatus. An asynchronous validity checking system and method utilizing digital counters reset by sensed transitions of signals on a plurality of conductors has been found to be preferred to accomplish the desired end.

It is therefore an object of this invention to provide a novel system and method for monitoring a plurality of electrical conductors to assure the occurrence of transitions of the signals on each conductor.

It is another object of this invention to provide a novel system and method for monitoring a plurality of electrical conductors having phase-related clock signals thereon from a master oscillator to assure transition of each clock signal on each conductor.

It is another object of this invention to provide a novel system and method for monitoring phase-related clock signals adjacent to the distribution point of the clock signals to a controlled device.

It is still another object of this invention to provide a novel system and method for monitoring phase-related clock signals from a master clock and automatically effectively stop said clock if any one of the clock signals is sensed to be defective.

It is yet another object of this invention to provide a novel asynchronous system and method.

It is still another object of ths invention to provide a novel asynchronous validity checking system and method using digital counters reset by sensed transitions of signals on a plurality of monitored conductors.

With these and other objects in view, as will become apparent to one skilled in the art as the description proceeds, this invention resides in the novel construction, combination, and arrangement of parts substantially as hereinafter described and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which.

DESCRIPTION OF THE INVENTION

Figure 1:
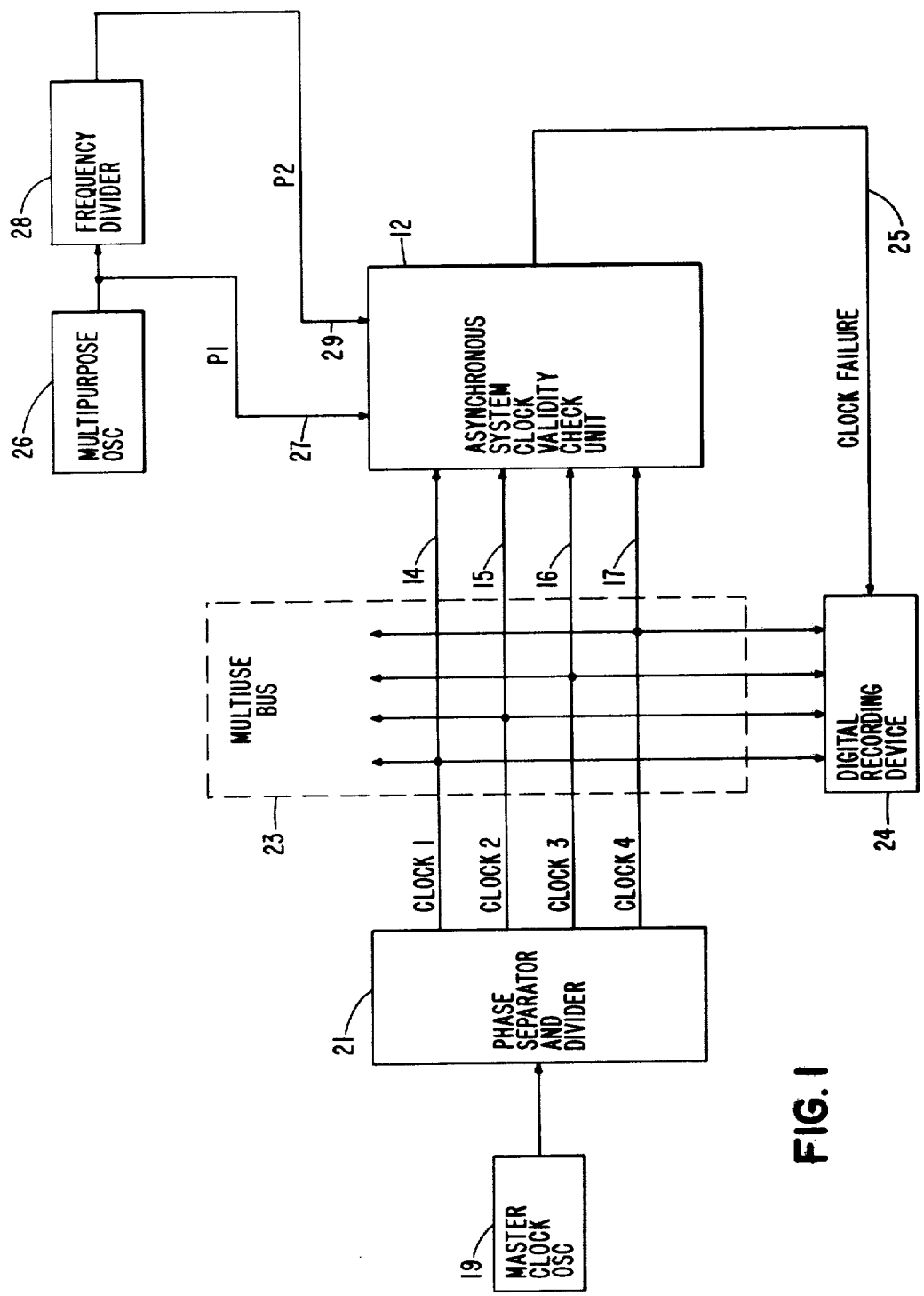
FIG. 1 is a block diagram illustrating the system of this invention connected with a plurality of conductors for monitoring clock pulses on said conductors being coupled to a magnetic data recording device.

Referring now to the drawings, the system 12 of this invention, which system relates to asynchronous system clock validity checking, is shown, for illustrative purposes in FIG. 1, connected to monitor a plurality of clock pulses appearing on separate electrical conductors 14, 15, 16 and 17.

As shown, the clock pulses are derived from a conventional master clock oscillator 19 with the output from the oscillator being coupled to a conventional phase separator and divider 21 to produce phase-related clock signals that are distributed by a multiuse bus 23 to controlled apparatus, such as a magnetic data recording device 24, as is well known to one skilled in the art. Magnetic data recording device 24 can be, for example, a motor driven digital recorder with timing clock also generating recording signal timing. Thus, it can be readily appreciated that the system of this invention provides a means for protecting critical system components, power amplifiers, motors, recording media, etc. in a clocked system.

As can also be appreciated from FIG. 1, system 12 senses transitions of the clock pulses on conductor 14, 15, 16, and 17 adjacent to the distribution point, or junction, of the clock pulses to the controlled apparatus, and a clock failure indication from system 12 can be coupled on lead 25 to the controlled apparatus (indicated to be a magnetic data recording device) or to a turn off system to automatically switch the apparatus from the master clock 19, to another oscillator or to the timing oscillator, for example, when a defective clock signal is sensed by system 12.

System 12 of this invention utilizes a timing signal generator, shown as a multi-purpose oscillator 26 in FIG. 1, to supply timing signals to the system. This timing signal generator is independent of master clock oscillator 19 and the output signal is asynchronous with respect to the clock signal outputs from the master clock. As shown in FIG. 1, multi-purpose oscillator 26 supplies a timing signal (P1) on lead 27 to system 12, while a frequency related timing signal (P2) is supplied to system 12 through frequency divider 28 and lead 29.

Figure 2:
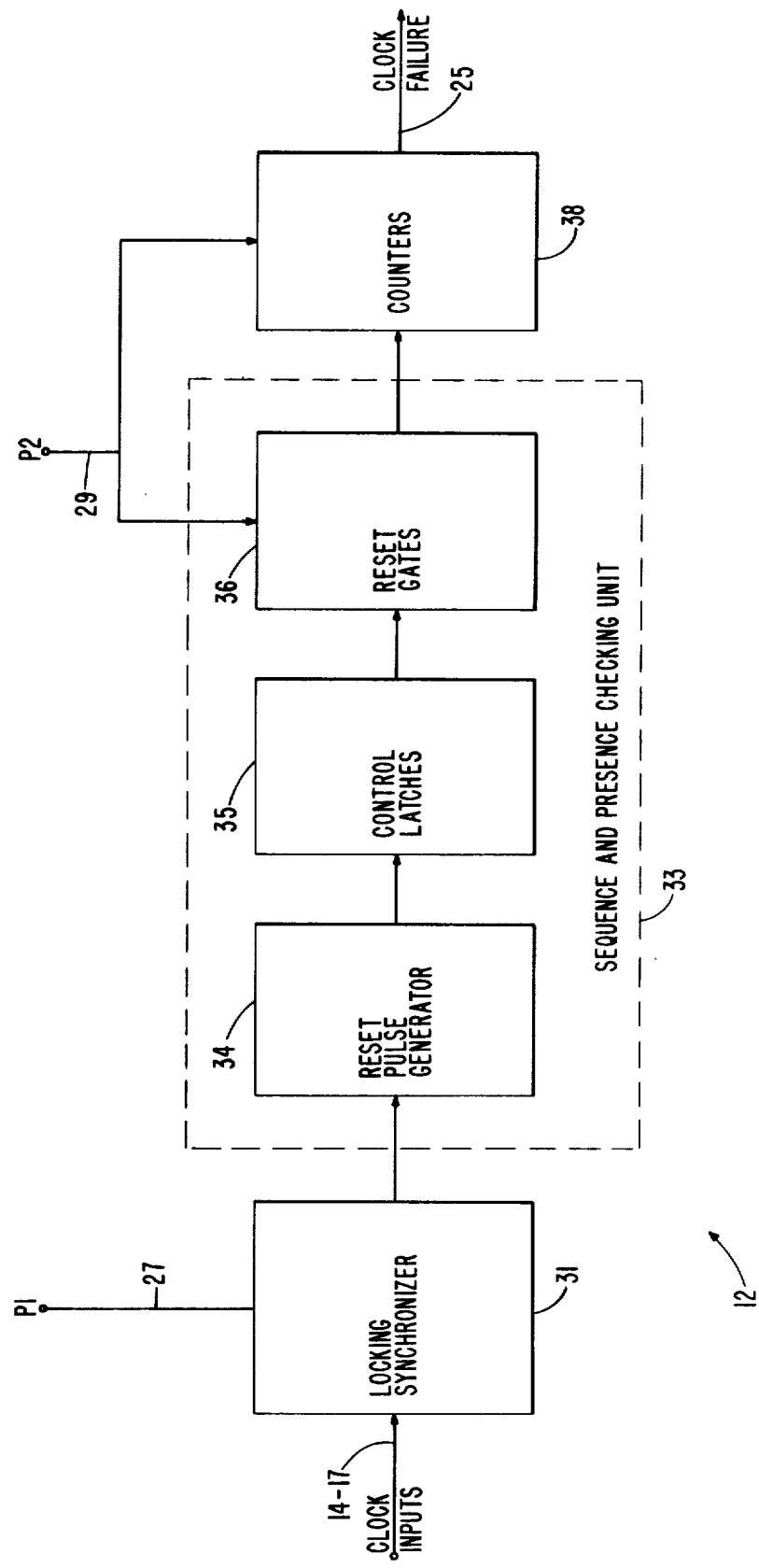
FIG. 2 is a block diagram of the system of this invention.

System 12 is shown by the block diagram of FIG. 2 to include a locking synchronizer 31 which receives the clock pulses on electrical conductors 14 through 17 and timing pulses P1. The locking synchronizer 31 operates to phase hold and lock the clock signals into the system with the output signals coupled from the locking synchronizer being coupled to sequence and presence generating unit 33, and, more particularly, to reset pulse generator 34 in the sequence and presence checking unit.

Reset pulse generator 34 is connected with control latches 35, which latches are, in turn, connected to reset gate 36. The output from the sequence and presence checking unit 33 is coupled from the reset unit to counter unit 38, with the counter unit being incremented by counter pulses P2 on lead 29 (which pulses are also coupled to the reset gate 36).

The counters of counter unit 38 are free-running and are reset by pulses from the sequence and presence checking unit 33. Each counter has a predetermined time-out period so that so long as the counters are reset and not allowed to time-out, no clock failure indication is produced by the counter unit. If a clock pulse is sensed to be defective, however, then a counter will time-out and a fault indication of clock failure will be produced and coupled from the system on lead 25.

Figure 3:
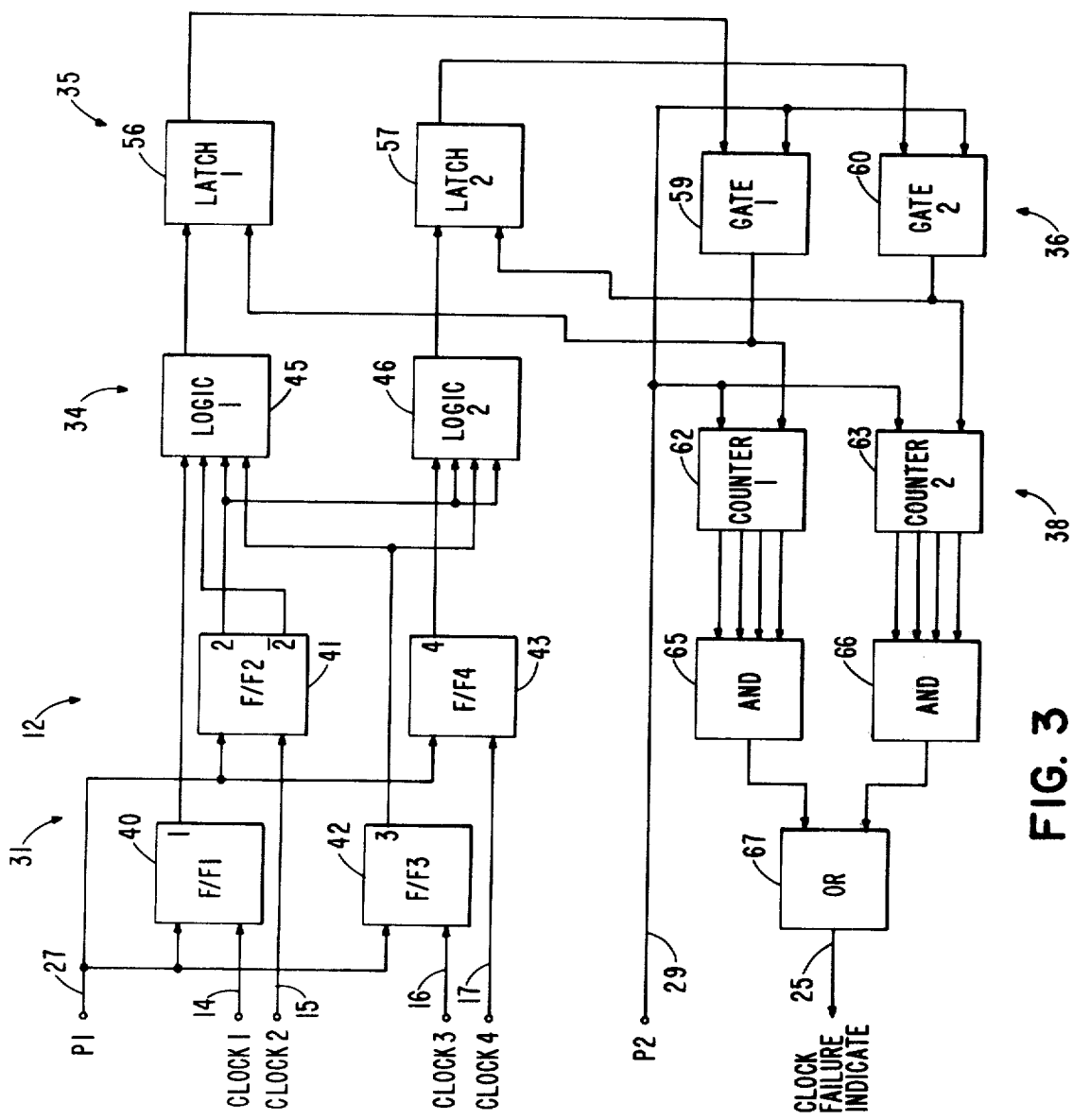
FIG. 3 is a detailed block diagram of the system of this invention.
Figure 7:
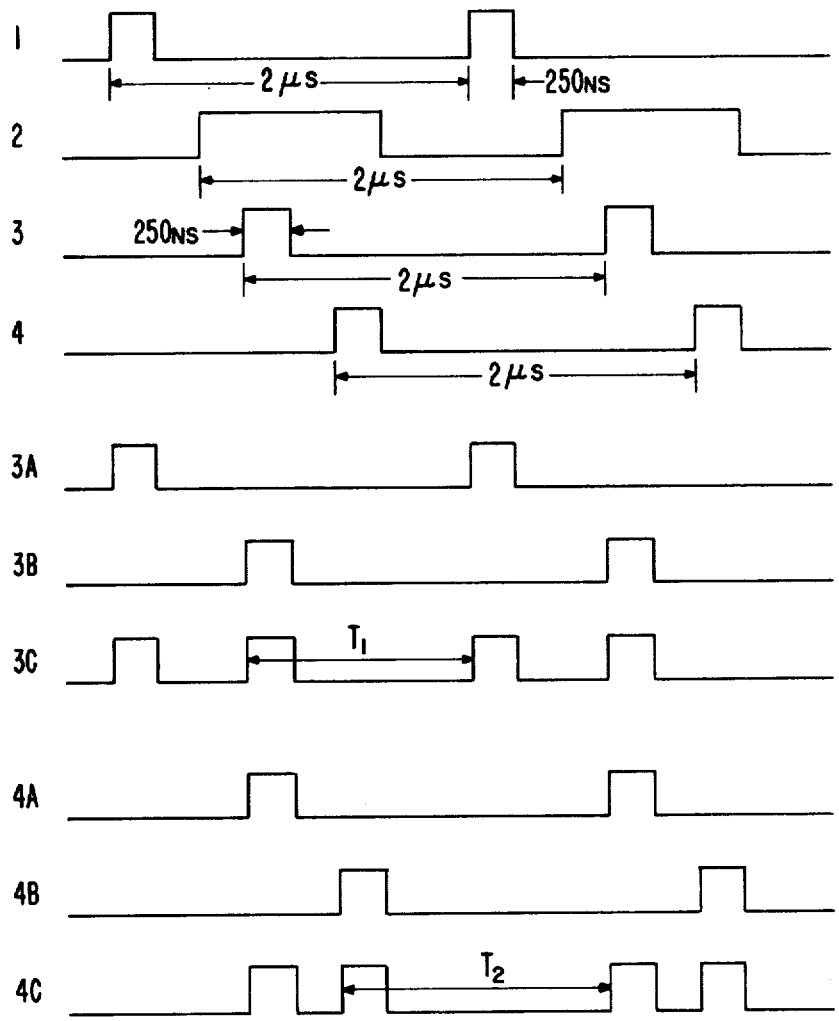
FIG. 7 is a timing diagram of typical operation of the system of this invention as illustrated in FIGS. 3–5 with no sensed defective clock pulses.

As shown in FIG. 3, locking synchronizer 31 includes four flip-flops 40, 41, 42, and 43, each of which receives a different clock pulse on conductors 14, 15, 16, and 17, respectively, at the data input of each (said clock pulses being essentially the same as shown for the flip-flop outputs in FIG. 7). As also shown in FIG. 3, timing pulses P1 on lead 27 are also coupled to the flip-flops at the clock input so that the flip-flops operate as phase holds. The phase holds must be of the edge-triggered type so that the outputs therefrom will not change while timing signal P1 is active. In a working embodiment of this invention, Ser. No. 7474 Dual D-Type Edge-Triggered Flip-Flops were successfully utilized.

Figure 6:
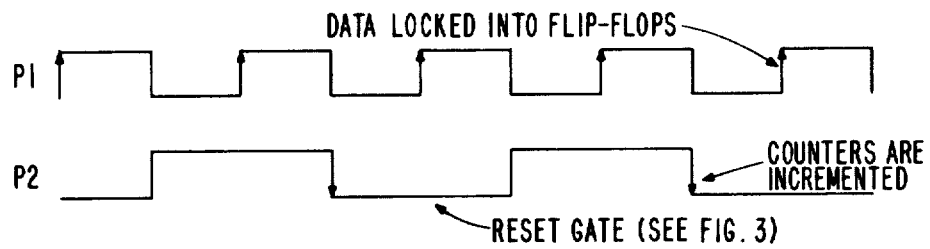
FIG. 6 is a timing diagram of typical timing signals (P1 and P2) coupled to the system of this invention as shown in FIG. 3.

Timing signals P1 originate from an independent timing signal generator 26, which preferably is a free-running asynchronous clock operating at a frequency different from that of master clock oscillator 19. in a working embodiment of this invention, timing signals P1 of 7 MHz were successfully utilized with a master clock oscillator of 8 MHz being coupled to a phase separator and divider 21 to produce four phase signals on conductor 14 through 17 with the frequency of the timing signal P1 being preferably at least ten times the frequency of the clock signals (see the timing diagrams of FIGS. 6 and 7). In a working embodiment, the 7 MHz timing signal was divided by two by frequency divider 28 so that a 3.5 MHz counter signal P2 was coupled to counter unit 38, as shown in the timing diagrams of FIG. 6. The clock pulses are locked into the flip-flops on the rising leading edges of the timing signal pulses P1, while the counters are incremented on the falling trailing edges of the counter signal pulses P2, as also indicated in FIG. 6.

Figure 4:
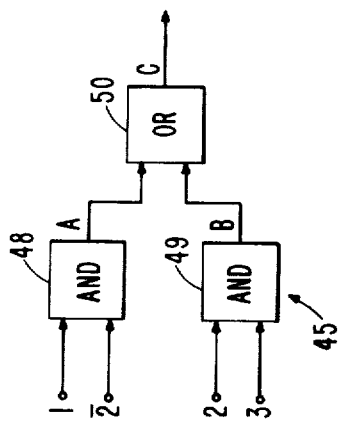
FIGS. 4 and 5 are schematic diagrams of logic gates shown in block form in FIG. 3.
Figure 5:
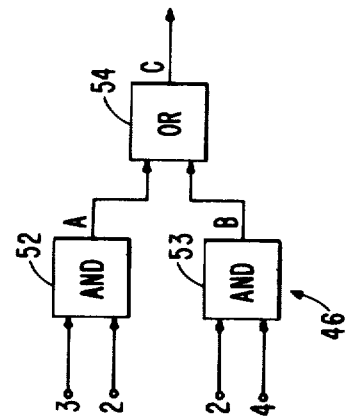

The Q outputs from flip-flops 40 (designated 1 for flip-flop 1), 41 (designated 2 for flip-flop 2), and 42 (designated 3 for flip-flop 3), and the $\overline{Q}$ output from flip-flop 41 (designated $\overline{2}$ for flip-flop 2) are coupled to a first logic circuit 45 of reset pulse generator 34, while the Q outputs from flip-flops 41 (designated 2 for flip-flop 2), 42 (designated 3 for flip-flop 3), and 43 (designated 4 for flip-flop 4) are coupled to a second logic circuit 46 of reset pulse generator 34. Logic circuits 45 and 46 are preferably AND-OR circuits, and are shown in FIGS. 4 and 5 to preferably include a pair of gates 48 and 49 connected with OR gate 50 (logic circuit 45), and a pair of AND gates 52 and 53 connected with OR gate 54 (logic circuit 46). In a working embodiment of this invention, Ser. No. 7450 Expandable Dual 2-Wide 2-Input AND-OR-INVERT Gates were successfully utilized.

A timing diagram is shown in FIG. 7 to illustrate operation of the system of this invention with no defective clock pulses derived from a master clock operating at a frequency of 8 MHz and utilizing 7 MHz timing pulses P1 (as shown in FIG. 6). The timing diagram of FIG. 7 illustrates the output pulse trains to and from logic circuits 45 and 46 with the outputs being coupled through latch circuits 56 and 57 (identified generally as control latches 35), respectively, to gate 59 and 60 (identified generally as reset gates 36). Gates 59 and 60 also receive the counter signal P2, as shown in FIG. 6, as do counters 62 and 63 (generally designated as counter unit 38).

As shown in FIG. 7, the outputs from the flip-flops (designated at 1, 2, 3, and 4) constitute different output pulse trains coupled to logic circuits 45 and 46 and the output pulse trains (3C and 4C) from the logic circuits are dependent upon the inputs thereto, and the output pulse trains from the logic circuits are used to reset counters 62 and 63, respectively. These counters are free-running and are reset only when pulses are produced due to sensed transitions of the clock pulses (since control latches 56 and 57 are edge-triggered). As long as clock pulse transitions are sensed within a predetermined time period (or decode) to reset each counter before the counter times out, then no output is produced from the counters 62 and 63 through AND gates 65 and 66 and OR gate 67 to produce the clock fault indication on lead 25. In a working embodiment of this invention, Ser. No. 7493 4-Bit Binary Counters were successfully utilized. In addition, the various AND and OR gates have been successfuly implemented in a working embodiment of this invention by Ser. No. 7400 Quadruple 2-Input Positive NAND gates.

Each decode (or predetermined time period) is chosen so that the time it represents is greater than the largest period between reset pulses. Thus, the decode of counter 62 represents a time greater than T1 (see FIG. 7) but less than 2T1. Therefore, if a defect occurs in any of the clock pulses 1, 2, or 3, or any combination of them (either positive or negative), a reset pulse will not be produced before counter 62 times out (i.e., reaches its decode) and a fault indication will be produced to indicate a defect, or failure.

In like manner, the decode of counter 63 represents a time greater than T2 but less than 2T2. If a defect occurs in any of the clock pulses 2, 3, or 4, or any combination of them (either positive or negative), counter 63 will time out and a fault indication will be produced to indicate a defect, or failure.

As can be appreciated from the foregoing, the system of this invention is utilized to validate the sequence of a set of synchronous sequential pulses asynchronously, and can detect a defect in a clock pulse regardless if stuck in a 0 or a 1 logic state.

Figure 8:
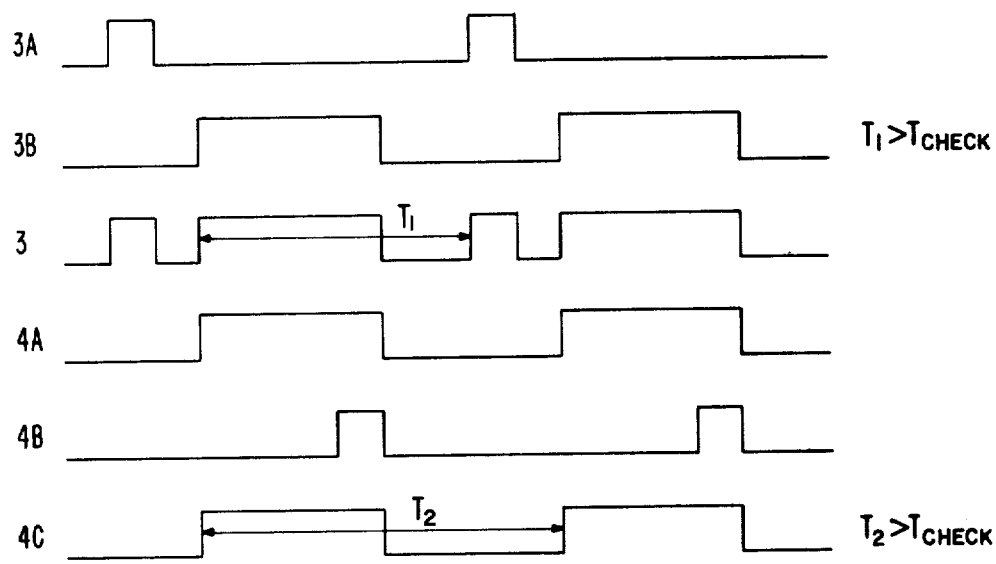
FIGS. 8 and 9 are timing diagrams of typical operation of the system of this invention as illustrated in FIGS. 3–5 with different sensed defective clock pulses.
Figure 9:
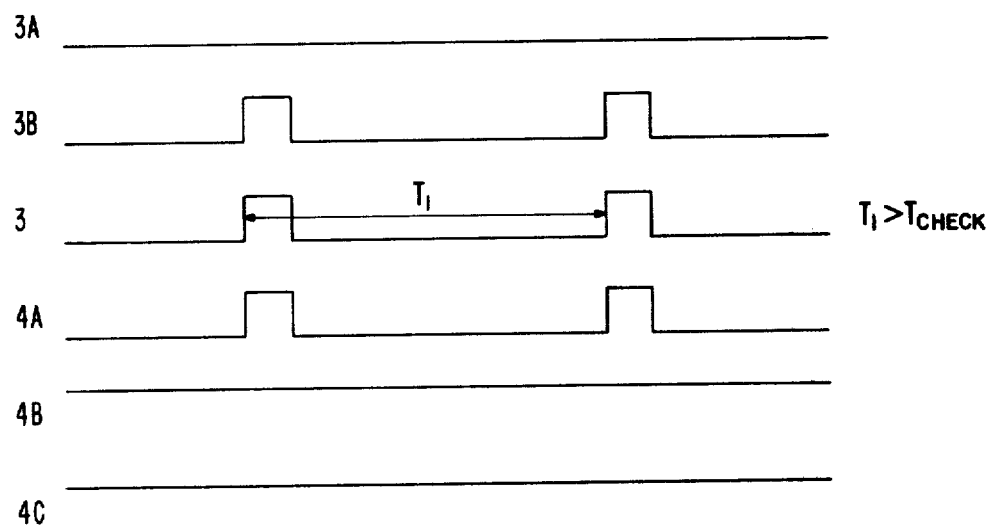

In FIG. 8, a typical timing diagram is shown in conjunction with FIGS. 3, 4 and 5 to illustrate an example of a clock pulse defect where clock pulse 3 is stuck at a logic 1 state. In FIG. 9, another typical timing diagram is shown in conjunction with FIGS. 3, 4 and 5 to illustrate an example of another clock pulse defect wherein clock pulses 2 and 4 are stuck in the logic 1 state. In each case, it can clearly be appreciated that a counter will time out since no reset pulse is provided to the associated counter within the preselected time period, and hence a fault indication will be produced indicative of the defect. While not specifically shown by further timing diagrams, it can be appreciated that the system of this invention can be utilized to detect failure of transition of any of the clock pulses regardless of whether stuck in the logic 1 or logic 0 state.

While the invention has been particularly described with respect to phase-related clock pulses from a master clock, it is meant to be realized that the invention could be utilized to monitor other groups of electrical conductors having signals thereon occuring within a predetermined time period, and the timing and/or clock pulses could be of frequencies other than as specifically set forth herein for illustrative purposes. In addition, the system of this invention could handle sensing of signal transitions on additional conductors by adding additional circuitry for sensing said transitions and coupling signals indicative thereof to counters in the same manner as described herein as would be obvious to one skilled in the art.

Thus, while this invention has been particularly shown and described with reference to preferred embodiments thereof, it will be understood by those skilled in the art that various changes in form and details may be made therein without departing from the spirit and scope of the invention.

What is claimed is:

1. A system for monitoring a plurality of separate electrical conductors for a series of transitions of line signals separately occurring on each of said conductors, said signals being timed by a first clock means, said system comprising:

timing signals generating means providing first and second timing signals independent of the timing of said clock means such that said timing signals are asynchronous with respect to said line signals on said electrical conductors;

signal processing means connected with said timing signal generating means to receive said first timing signal therefrom and connected with said plurality of electrical conductors to sense transitions of said line signals on each of said conductors and responsive thereto for producing an output signal dependent upon said sensed series of transitions following a given transition;

timing means in said fault determining means responsive to said given transition indicating a predetermined time period after said given transition; and fault determining means connected with said timing signal generating means to receive said second timing signal therefrom and connected with said processing means to receive said output signal therefrom and responsive therefrom for producing a fault indication in the absence in said output signal of a sensed series of transitions on said conductors within said predetermined time period after said given transition.

2. The system of claim 1 wherein said signal processing means includes means for producing said output signal in a manner such that said output signal has a train of pulses the occurrence of each of which is dependent upon the time-wise relationship between said transitions sensed on different ones of said electrical conductors, and wherein said timing means establishes said predetermined time period has means operative in accordance with any one of a plurality of said sensed transitions and wherein said predetermined time period has various durations for different ones of said sensed transitions and whereby said fault indication is produced if the spacing between preselected pulses of said train of pulses is greater than said predetermined time period for said any one sensed transition.

3. The system of claim 1 wherein said signal processing means includes a sequence and presence checking unit for receiving indications of said sensed transitions on said electrical conductors and producing a train of pulses therefrom, and wherein said fault determining means includes counter means connected to receive said output train of pulses from said sequence and presence checking unit and said second timing signal from said timing signal generating means, said counter means producing said fault indication if said train of pulses are not received from said sequence and presence checking unit in a predetermined manner within said time period.

4. The system of claim 3 wherein said sequence and presence checking unit includes a reset pulse generator, control latches, and a reset gate.

5. The system of claim 4 wherein said signal processing means includes a latching synchronizer connected to receive said first timing signal from said timing signal generating means and to sense said transitions on said electrical conductors and responsive thereto providing pulses indicative of sensed transitions to said reset pulse generator.

6. The system of claim wherein each of said electrical conductors carry different line signals in multiple phases, and wherein said system provides a fault indication if any transition fails to occur in any said series of said line signals.

7. The system of claim 6 wherein said system is connected adjacent to the distribution point of said clock signals from a master clock, and wherein said fault indications may be utilized for automatic switching from said clock if the absence of any transition of a clock signal is detected.

8. The system of claim 7 wherein said system is connected with a recording channel for a magnetic recorder with said timing signal generating means generating recording signal timing, and wherein said fault indication is utilized to automatically switch said master clock from said magnetic recorder.

9. In a unit having a plurality of separate electrical conductors each of which carries a different clock signal of a set of phase-related clock signals from a master clock, for distribution to a control device, an asynchronous clock validity checking system, comprising:
timing signal generating means producing first and second timing signals that are independent of said master clock;
pulse processing means connected with said timing signal generating means to receive said first timing signal therefrom and connected with said plurality of separate electrical conductors to sense said different clock pulses carried by respective ones of said separate electrical conductors and responsive thereto for producing an output train of pulses the occurrence of each of which is dependent upon a given sequential diverse relationship of said sensed clock pulses, one output pulse for each of said diverse relationships; and
fault determining means connected to receive said second timing signal from said timing signal generating means and connected with said pulse processing means to receive said output train of pulses therefrom, said fault determining means producing a fault indication in a predetermined response to predetermined ones of said output train of pulses from said pulse processing means fail not occurring within a predetermined time period.

10. The system of claim 9 wherein pulse processing means includes a locking synchronizer connected with said electrical conductors and said timing signal generating means to phase hold and lock said clock signals into said system, the output from said locking synchronizer being coupled to said pulse processing means.

11. The system of claim 10 wherein said locking synchronizer includes a plurality of flip-flops each of which is connected to receive said first timing signal from said timing signal generating means and a different one of said clock pulses from said master clock.

12. The system of claim 9 wherein said pulse processing means includes a sequence and presence checking unit having a reset pulse generator, control latches and a reset gate with said reset pulse generator being connected to receive said clock pulses and said reset gate being connected to receive said second timing signal.

13. The system of claim 9 wherein said fault determining means includes digital counter means connected to receive said second timing signal for incrementing said counter means and connected to receive said output train of pulses from said pulse processing means to reset said counter means.

14. The system of claim 9 wherein said control device is a motor driven digital control device, and wherein said system automatically switches said master clock from said digital control device upon production of a fault indication.

15. A system for monitoring a plurality of separate electrical conductors for the presence of transitions in pulses on each of said conductors, said system comprising:
pulse processing means connected with each of said electrical conductors to sense transitions in pulses carried thereon and responsive thereto for producing an output train of pulses having a spacing dependent upon the time-wise relationship between said transitions;
a digital timer having a predetermined time-out period greater than the elapsed time period between pulses included in said output train of pulses from said signal processing means with no pulses absent, said digital timer receiving said train of output pulses from said pulse processing means and producing a fault indication only if said predetermined time-out period elapses between said pulses in said output train of pulses to thus indicate the absence of a transition of a pulse in at least one of said electrical conductors; and
said plurality of said electrical conductors includes four conductors carrying different phases of a timing signal, and wherein said digital timer includes a pair of counters for determining the absence of a transition of a pulse on said four conductors.

16. A system for monitoring a plurality of separate conductors each of which carries a different one of phase-related clock signals from a master clock for distribution to a controlled device, said system comprising:
first input means for receiving a timing signal generated from a clock signal generator independent of said master clock;
locking synchronizer means having a plurality of flip-flops each of which is connected with a different one of said electrical conductors to receive a different one of said clock signals, and with said input means to receive said timing signals, each of said flip-flops producing an output signal dependent upon the sensed transitions of said clock signal on said electrical conductor connected therewith;
logic means connected with said locking synchronizer means to receive said output signals from said flip-flops, said logic means producing an output train of pulses with a spacing between pulses that is dependent upon said received output signals from said flip-flops;
second input means for receiving a timing signal that is frequency related to said timing signal generated from said clock signal generator;

counter means connected with said second input means for receiving said timing signal therefrom from incrementing said counter means, said counter means also receiving said output train of pulses from said logic means for resetting said counter means, said counter means providing an output indicative of a fault if said counter means is not reset within a predetermined time period; and output means connected with said counter means for coupling a fault indication from said system when said counter means produces a fault indication.

17. The system of claim 16 wherein said plurality of electrical conductors includes four conductors, wherein said locking synchronizer means includes four flip-flops, wherein said logic means include a pair of AND-OR circuits, and wherein said counter means includes a pair of digital counters.

18. The system of claim 17 wherein said system includes a pair of latches and a pair of reset gates connected with said logic means.

19. A method for monitoring a plurality of separate electrical conductors each of which carries phase-related clock signals from a master clock for distribution to a controlled device, said method comprising:

providing a first timing signal independent of said master clock;

receiving said clock signals and said first timing signal and developing therefrom output pulse signals indicative of sensed transitions of each of said clock signals;

developing from said output pulse signals a train of pulses with the time-wise spacing between pulses of said train being dependent upon coincidence of pulses in said output signals developed from said clock signals;

providing a second timing signal independent of said master clock but frequency related to said fit timing signal;

incrementing a counter with said second timing signal with said counter being reset by said train of pulses; and providing a fault indication if said counter is not reset within a predetermined period of time, said fault indication indicating absence of a transition in at least one of said clock signals.

20. The method of claim 19 wherein said method includes producing a plurality of trains of pulses for resetting a plurality of counters incremented by said second timing signal with a fault indication being produced if any one of said counters is not reset within a predetermined time period for each of said counters.

21. The method of claim 19 wherein said method includes automatically switching said master clock from said controlled device when a fault indication is produced indicating at least one of said clock signals is defective.

* * * * *